(12) United States Patent
Bonneau et al.

(10) Patent No.: US 7,533,317 B2
(45) Date of Patent: *May 12, 2009

(54) SERIALIZER/DESERIALIZER CIRCUIT FOR JITTER SENSITIVITY CHARACTERIZATION

(75) Inventors: Dominique P Bonneau, La Rochelle (FR); Philippe Hauviller, Itteville (FR); Vincent Vallet, Mennety (FR)

(73) Assignee: International Business Machines Corporation, Armonk, NY (US)

( * ) Notice: Subject to any disclaimer, the term of this patent is extended or adjusted under 35 U.S.C. 154(b) by 48 days.

This patent is subject to a terminal disclaimer.

(21) Appl. No.: 11/583,048

(22) Filed: Oct. 6, 2006

(65) Prior Publication Data

US 2007/0088998 A1    Apr. 19, 2007

Related U.S. Application Data

(62) Division of application No. 10/707,961, filed on Jan. 28, 2004, now Pat. No. 7,251,764.

(30) Foreign Application Priority Data

May 27, 2003    (EP)    ................................... 03368048

(51) Int. Cl.
    *G01R 31/28*    (2006.01)
(52) U.S. Cl. ................... 714/733; 714/700; 714/738; 714/744
(58) Field of Classification Search .............. 714/733, 714/738, 744, 700; 324/73.1
    See application file for complete search history.

(56) References Cited

U.S. PATENT DOCUMENTS

| | | | |
|---|---|---|---|
| 5,490,147 A * | 2/1996 | Kubo | ........................ 370/509 |
| 5,790,563 A | 8/1998 | Ramamurthy et al. | |
| 6,201,829 B1 * | 3/2001 | Schneider | ................... 375/221 |
| 6,215,835 B1 | 4/2001 | Kyles | |
| 6,222,380 B1 * | 4/2001 | Gerowitz et al. | .............. 326/38 |
| 6,658,363 B2 | 12/2003 | Mejia et al. | |
| 6,725,408 B1 | 4/2004 | Cao et al. | |
| 6,865,222 B1 | 3/2005 | Payne | |
| 7,017,098 B2 * | 3/2006 | Cao et al. | ................... 714/742 |
| 7,251,256 B1 * | 7/2007 | Barry et al. | ................ 370/503 |

OTHER PUBLICATIONS

Office Action (Mail Date Jan. 23, 2008) for U.S. Appl. No. 11/565,762, filed Dec. 1, 2006; Confirmation No. 4699.
Office Action (Mail Date Jul. 14, 2008) for U.S. Appl. No. 11/565,762, filed Dec. 1, 2006; Confirmation No. 4699.

* cited by examiner

*Primary Examiner*—Esaw T Abraham
(74) *Attorney, Agent, or Firm*—Anthony J. Canale

(57) ABSTRACT

Disclosed herein is an improved serializer/deserializer (SERDES) circuit (102) having built-in self-test capabilities that is configured to perform an in-situ jitter sensitivity characterization of the clock and data recovery (CDR) circuit (108). To that end, a delay perturbation is added to the serial data stream at the serializer (120) output, typically using a variable delay (DEL) line (116). Then, the perturbed serial data stream is looped back to the CDR circuit. A dedicated circuit in the control logic (112) coupled to the DEL line and the deserializer circuit (110) analyzes the recovered data to characterize the sensitivity of the CDR circuit to the jitter frequency. By continuously modifying the output delay of said serial data stream, i.e. the amplitude and the frequency of the perturbation, one can generate a perturbed serial data stream, very close to the real jittered data.

1 Claim, 4 Drawing Sheets

SERIALIZER/DESERIALIZER CIRCUIT FOR JITTER SENSITIVITY CHARACTERIZATION

This application is a divisional of U.S. application Ser. No. 10/707,961; filed on Jan. 28, 2004, now U.S. Pat. No. 7,251,764.

BACKGROUND OF INVENTION

1. Field of the Invention

The present invention relates to high speed serial communications data transfers between integrated circuits or systems and more particularly to an improved serializer/deserializer circuit having built-in self-test capabilities that is configured for jitter sensitivity characterization of the clock and data recovery circuit. A method for characterizing jitter sensitivity is also disclosed.

2. Background of the Invention

In the field of serial communications data transfers between integrated circuits or systems, it is common practice to exchange data between two telecommunications systems, one being referred to as the local SERDES circuit and the other as the distant SERDES circuit, each incorporating a serializer/deserializer (SERDES) function. In each SERDES circuit, the receiving part is usually provided with a clock and data recovery (CDR) circuit connected in series with the deserializer circuit that is in charge of extracting a clock signal, referred to as the recovered clock hereinbelow, from the incoming serial data stream. On the other hand, the emitting part is organized around the serializer circuit. In the case of high speed serial data communications, the performance of the CDR circuit is intimately tied to its capacity to correctly recover the transmitted data when the data period varies with time (jitter). Therefore, the characterization of the sensitivity of the CDR circuit placed in the deserializer part of the SERDES circuit to the jitter is of prime importance for the user to assess the quality of the data transfer.

The jitter tolerance of the CDR circuit is usually not characterized in-situ as it requires a jittered data generator, a specialized and expensive piece of characterization equipment. In addition, when such characterization is performed before delivery to the customer, it usually involves a few samples of the total order because of the time required to complete it.

Moreover, the jittered data generator must produce a realistic data stream, i.e. a set of frames formatted according to the transmission protocol under consideration, e.g. SONET/SDH protocol, if the deserializer under test is not itself configured to characterize its performance.

Lastly, without a jittered data generator, it is generally impractical to evaluate in-situ the quality of a particular physical link between the local and distant serializer/deserializer circuits or to determine if the CDR circuit is still working as specified.

The capabilities of standard characterization test equipment to generate high frequency jittered data is typically limited to a small percentage of the data transmission rate. For instance, in the case of SONET/SDH test equipment, if the jitter rate is equal to 1% of the transmission rate, it represents a 6 MHz jitter for a data transmission rate of 622 Mbps. This situation is exacerbated for the test equipment used in the manufacturing lines, because they are usually not able to run at full speed. Consequently, the CDR jitter tolerance is seldom verified at the manufacturing level. In summary, in the case of repeated losses of data or data corruption between distant serializer/deserializer circuits, an in-situ characterization of the CDR circuit jitter sensitivity is helpful in characterizing overall integrity of the communications network under consideration.

Published United States Patent Application No. 2001/0016929 A1 describes a built-in self-test (BIST) functional block that uses the serial loop back to test the CDR circuit operation in-situ. However the system and method described therein are limited to the functional test and cannot be used to assess and characterize the jitter immunity of the CDR circuit.

Commonly assigned U.S. Pat. No. 5,828,255 describes a method and circuit to reduce the jitter generated by a phase-locked loop (PLL) oscillator locked on a reference frequency by means of optimizing its operating range. However, this reference does not address the sensitivity of a CDR circuit to jittered data.

Finally, U.S. Pat. No. 5,563,921 proposes a method and circuits to detect and measure the jitter, but at the cost of requiring an additional PLL devoted to jitter detection. Moreover, there is no teaching as to a method of predicting whether data will be lost through the CDR circuit or whether the latter can recover the data with a sufficient margin.

SUMMARY OF INVENTION

The present invention is directed to providing an improved serializer/deserializer circuit having built-in self-test capabilities configured for in-situ jitter sensitivity characterization of the CDR circuit.

Another aspect of the present invention is to provide an improved serializer/deserializer circuit that does not require additional external test equipment such as a jittered data generator. The improved SERDES circuit has built-in self-test capabilities configured for jitter sensitivity characterization of the CDR circuit.

It is yet another aspect of the present invention to provide an improved serializer/deserializer circuit having built-in self-test capabilities configured for jitter sensitivity characterization of the CDR circuit that generates a perturbed data flow and analyzes if the data is recovered correctly.

It is still another aspect of the present invention to provide an improved serializer/deserializer circuit having built-in self-test capabilities configured for jitter sensitivity characterization of the CDR circuit that characterizes the jitter introduced by the physical link that connects it with any other physically remote serializer/deserializer circuit.

Finally, the present invention is also directed to providing an improved serializer/deserializer circuit having built-in self-test capabilities configured for jitter sensitivity characterization of the CDR circuit wherein the characterization may be done at each power-on or initiated at any time on request for self diagnostic purposes and wherein the characterization results can be stored in a register for further analysis.

According to the present invention there is described an improved serializer/deserializer (SERDES) circuit having built-in self-test capabilities that is configured to perform jitter sensitivity characterization of the clock and data recovery (CDR) circuit placed in the receiving part thereof. In essence, in the diagnostic mode, a perturbation is added to the serial data stream at the serializer output. Typically, the perturbation generator circuit includes a variable delay element. Then, the perturbed serial data stream is looped back to the CDR circuit. A dedicated circuit coupled to the perturbation generator circuit and to the deserializer circuit analyzes the recovered data to characterize the jitter sensitivity of the CDR circuit to any incoming data stream jitter. Moreover, the perturbed data stream can be transmitted to a distant SERDES circuit before it is looped back to the CDR circuit. In this case, in the distant SERDES circuit, the receiver output is directly connected to the driver input. By comparing the jitter sensitivity with and without using the transmission lines, one can easily and in situ characterize the amount of jitter added by the transmission lines. In addition, by continuously modifying the output delay of the serial data stream, i.e. the amplitude and the frequency of the perturbation, a perturbed serial data stream may be generated, closely approximating the actual jittered data. When such a perturbed data stream is recovered through the deserializer, it is possible to characterize the sensitivity of the CDR circuit to the jitter frequency.

A method of characterizing the jitter sensitivity of the CDR circuit is also disclosed herein. This method includes the steps of: generating a serial data stream by the serializer that is continuously applied to the CDR circuit and the deserializer; inserting a start-of-frame pattern in the serial data stream; adding a perturbation delay to said serial data stream to produce a perturbed serial data stream; inserting a second start-of-frame pattern in the serial data stream; determining whether the deserializer has found that the second start-of-frame pattern has the same bit alignment as the first start-of-frame pattern; if yes, this means that the CDR circuit is immune to that perturbation and if not, this means that the CDR circuit would be sensitive to a jitter having the same magnitude as this perturbation.

Therefore, verification of the jitter tolerance performance of the CDR circuit placed in a serializer/deserializer circuit may be accomplished at the manufacturing level. In addition, this jitter sensitivity characterization can be performed at each power-on or initiated at any time on request for self diagnostic purposes. Admittedly, the jitter tolerance is the most critical CDR circuit specification to be met and also is the most important parameter to maintain the Bit Error Rate (BER) performance at the receiving side (CDR and DES circuits). Finally, the test coverage is improved and consequently the product quality delivered to the customer.

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

DETAILED DESCRIPTION

Figure 1:
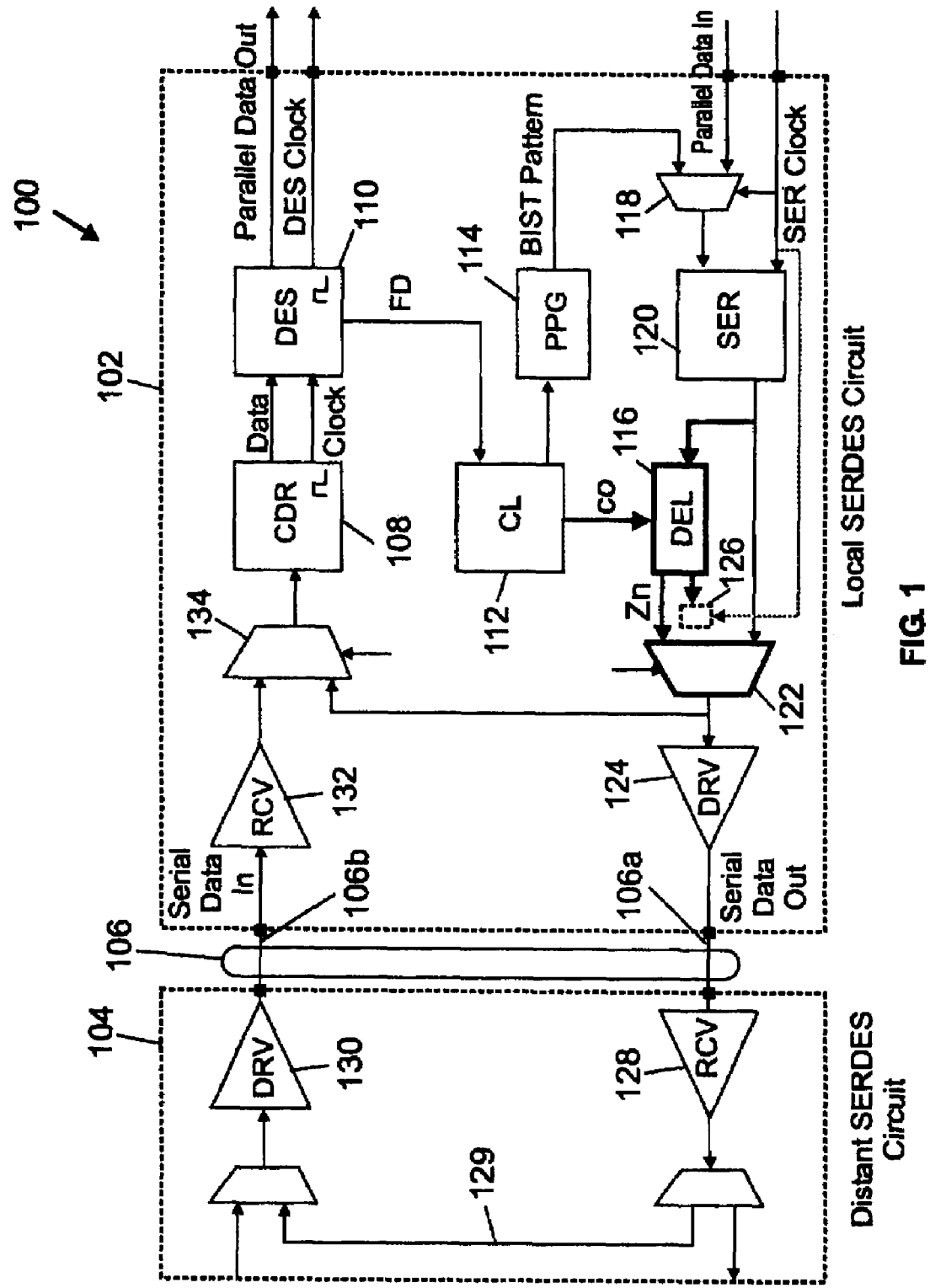
FIG. 1 schematically shows a block diagram of a telecommunication system comprising a local SERDES unit coupled to a variable delay line and a distant SERDES unit.

A telecommunication system 100 includes a local SERDES circuit 102, improved according to the present invention, and a distant SERDES circuit 104 is shown in FIG. 1. SERDES circuits 102 and 104 are connected by two physical transmission lines forming the link represented by bus 106 that transports the serial data streams for data exchange between the two components. In essence, the SERDES circuit 102 of the present invention represents an improvement over prior art SERDES circuits having built-in self-test (BIST) capabilities. See for example FIG. 2 of United States Patent Application Publication No. 2001/016929 A1 noted above.

The receiving side of the local SERDES circuit 102 is constructed around the clock and data recovery (CDR) circuit 108 (receives the serial data from the distant SERDES circuit 104) and the DES circuit 110 which are connected in series. The CDR circuit 108 generates recovered serial data and clock. The DES circuit 110 transforms these recovered serial data into parallel data (bytes) and generates a clock referred to as the DES clock adapted to this format change. The DES circuit 110 further generates a specific signal FD to detect the start-of-frame patterns. The FD signal is applied to the control logic (CL) circuit 112, which includes a state machine to control all the operations performed by the local SERDES circuit 102 and counters to define time intervals and status registers. CL 112 generates two important signals. A first signal is applied to the programmable pattern generator (PPG) circuit 114 that generates the BIST patterns. A second signal labeled CO is applied to a variable delay (DEL) line 116. According to the present invention, the CL circuit 112 controls the variation of the delay of the DEL line 116 via signal CO, i.e. the magnitude and the frequency of the perturbation that will be applied to the DEL line 116 to select the adequate delay. The PPG circuit 114 generates pseudo frames filled with programmable patterns so that the CDR circuit 108 will see a sufficient switching activity to recover a clock from the incoming serial data stream. The pseudo frames are separated by the start of frame patterns which are dependent on the standard under consideration. The PPG circuit 114 feeds a two-way selector 118 with generated pseudo frames. The selector 118 thus allows to apply either the incoming parallel data to be serialized before transmission or the BIST patterns to the SER circuit 120 so that a serial stream suitable for self-test can be generated in situ at very low cost. The SER circuit 120 which receives a clock labeled SER clock, generates a serial data stream which is applied to DEL line 116. DEL line 116 therefore performs the key function of adding a delay perturbation to the serial data stream output by SER circuit 120. The perturbed data stream is labeled Zn. The inputs of a two-way selector 122 are connected to the outputs of the SER circuit 120 and the DEL line 116. Its output is connected to the driver (DRV) 124 that transmits the serial data stream, perturbed or not, to the distant SERDES circuit 104 via line 106a which is part of the link 106. Although not necessary to the local SERDES circuit 102 operation, a calibration circuit 126 can be inserted between the DEL line 116 and selector 122 as a significant improvement of the present invention. The serial data emitted by driver 124 are sent to distant SERDES circuit 104 via receiver (RCV) 128 for processing therein. On the other hand, serial data sent by the driver 130 of the distant SERDES circuit 104 via line 106b are applied to the input of the receiver 132 of the local SERDES circuit 102 for amplification as standard. The output of receiver 132 is connected to the first input of a two-way selector 134, which, according to the present invention, also receives the output of selector 122 on its second input. Selectors 118, 122 and 134 are controlled by the CL circuit 112. The role of optional circuit 126 is to calibrate the DEL line 116 versus the SER clock as explained infra. Note that in FIG. 1, the logic blocks that are novel vis-à-vis the circuit described in FIG. 2 of US Patent Application Publication No. 2001/016929 A1 are highlighted with bold lines.

The programmable pattern generator 114 still feeds the SER circuit 120, so there is no substantial change in both the normal and self-test modes.

In normal operation, the selector 118 applies the data (Parallel Data In) formatted in bytes to SER circuit 120. In turn, the serial data stream emitted by SER circuit 120 is directly sent to the driver 124 via selector 122 (thus by-passing the DEL line 116), then transmitted to the distant SERDES 104 for processing. With respect to the incoming serial data stream sent by the distant SERDES, the CDR circuit 108 recovers the serial clock and data via receiver 132 and selector 134 and transmits recovered data and clock signals to the DES circuit 110 in accordance with the particular data transmission protocol employed.

In self-test operation, the BIST pattern generated by PPG circuit 114 is sent to SER circuit 120 via selector 118 for serialization. Then selector 122 selects the direct serial signal (still by-passing the DEL line 116) to be applied to CDR circuit 108 via selector 134, which is processed in CDR circuit 108 and in DES circuit 110. Signal FD generated by DES circuit 110 is applied to CL circuit 112 which is connected to the PPG circuit 114 to terminate the self-test loop.

According to the present invention, a diagnostic mode is added for characterizing the CDR circuit 108 to jitter sensitivity. In this mode, a BIST pattern is still applied to the SER circuit 120 (as in the self-test mode) to generate a serial data stream that includes an embedded first start-of-frame pattern. But now, the serial data stream generated by SER circuit 120 passes through DEL line 116 where it is perturbed according to the delay characteristic. A second start-of-frame pattern is then inserted in the data stream. The perturbed serial stream is looped back to the CDR circuit 108 via selectors 122 and 134, so that it replaces the incoming serial data stream that normally comes from the receiver 132. The CL circuit 112 controls the DEL line 116 delay and checks for recovered data. The FD signal feeds the CL circuit 112 to indicate a valid data recovery. When this FD signal is not received when expected, this means that at least one bit of data has been mis-recovered through the CDR circuit 108, and a data error is subsequently logged. In other words, the CL circuit 112 determines whether the deserializer has found that the second start-of-frame pattern has the same bit alignment as the first start-of-frame pattern. If yes, this means that the CDR circuit is immune to the induced perturbation and if not, this means that the CDR circuit would be sensitive to jitter having the same magnitude as the perturbation introduced by the DEL line 116. Therefore, the jitter sensitivity of the CDR circuit 108 is, using this method, characterized as the minimum delay increment causing a data error. In addition, the perturbed data stream can be transmitted to the distant SERDES circuit 104, then looped back to the CDR circuit 108 using the direct serial loop back 129, the CL circuit 112 can compare the received data pattern with the transmitted data pattern and stores the delay value of that configuration of the DEL line 116 causing this data error in a dedicated register. The comparison of the sensitivity to jitter with and without using the distant SERDES circuit 104 direct loop back characterizes the quantity of jitter added by the physical transmission link (including local and distant drivers and receivers) and therefore its quality. The local SERDES circuit 102 improved according to the present invention allows the characterization of the jitter generated by the physical link 106, whether the lines 106a/106b are electrical or optical transmission lines.

The detection of the start-of-frame pattern that is conventionally performed in the DES circuit 110, is generally used to align the recovered data in byte segments. It is therefore a trivial task to extract the FD signal which represents the detection of the start-of-frame pattern on a byte boundary.

A convenient way of reducing circuit 102 into practice would first be to generate a serial data stream by the serializer that is continuously applied to the CDR circuit and the deserializer and to insert a start-of-frame pattern therein. Then, a perturbation delay is added to the serial data stream to produce a perturbed serial data stream. A second start-of-frame pattern is inserted in the serial data stream. The next step requires determining whether the deserializer has found that the second start-of-frame pattern has the same bit alignment as the first start-of-frame pattern. If yes, this means that the CDR circuit is immune to that perturbation and if not, this means that the CDR circuit would be sensitive to a jitter having the same magnitude as this perturbation.

Figure 2:
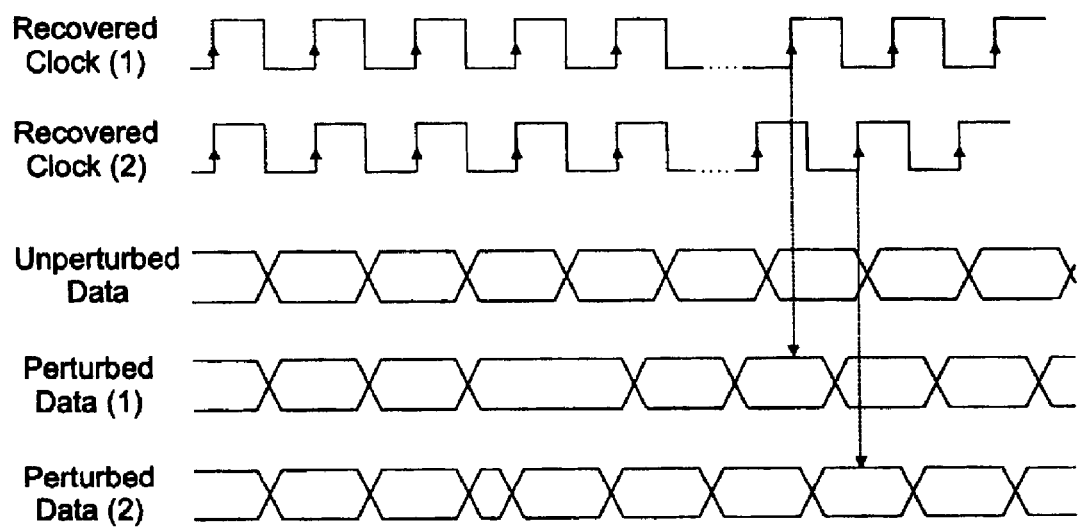
FIG. 2 shows an example of unperturbed data and two examples of perturbed data that are generated by the variable delay line according to the present invention and synchronized with the recovered clock.

FIG. 2 illustrates the waveforms of two sets of perturbed data signals that can be obtained with the DEL line 116 to allow a comparison between unperturbed data and perturbed data. In this example, it is assumed that the data is sampled in the CDR circuit 108 on the rising edge of the recovered clock. It is further assumed that the recovered clock frequency cannot change fast enough to follow the data perturbation, which is generally true as standard CDR circuits are based on narrow bandwidth PLLs for stability reasons. Turning to FIG. 2, there are shown an example of unperturbed data and two examples of perturbed data synchronized with the recovered clock. The input serial data stream labeled "perturbed data (1)" corresponds to a sudden increase of the delay of the DEL line 116. If the increase in delay is big enough, then the same data will be sampled twice and the recovered data flow at the CDR circuit 108 output will shift by one bit with the insertion of an extra bit in respect to the unperturbed data. Similarly, the input serial data stream labeled "perturbed data (2)" corresponds to a decrease of the delay of the DEL line 116. If the decrease in delay is large enough, then a bit will be missed by the CDR circuit 108 and its output will be shifted by one bit with respect to the perturbed data. As apparent in FIG. 2, after this sudden perturbation, the CDR circuit 108 will resynchronize the recovered clock according to the new serial data stream.

Figure 3:
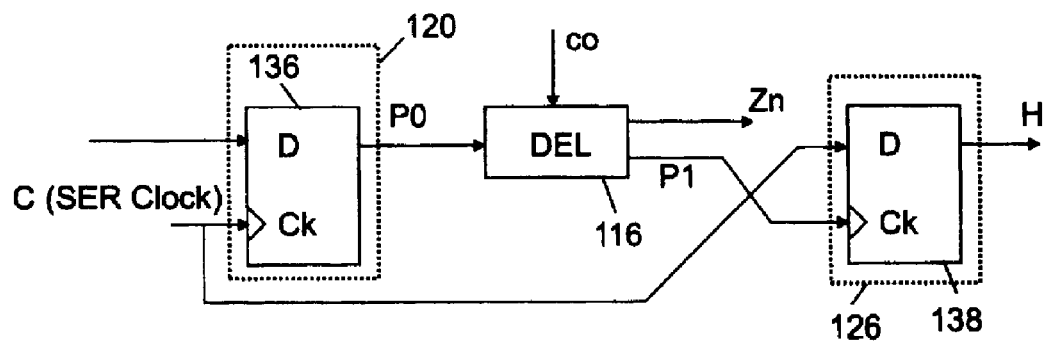
FIG. 3 shows the implementation of a simplified calibration circuit at the output of the variable delay line as a further improvement to the local SERDES unit of FIG. 1.

FIG. 3 is the schematic explaining the role of circuit 126 (reduced to a single flip-flop for the sake of simplicity) in the calibration of the DEL line 116. This calibration is needed to correlate the DEL line 116 delay with the SER clock period. As is apparent in FIG. 3, DEL line 116 receives control signal CO from CL circuit 112 to select different values of its delay characteristic. Flip-flop (or latch) 136 which is placed in SER circuit 120, delivers signal P0 which is the serial data stream at the SER circuit 120 output. The SER clock signal C is applied to the clock input Ck of flip-flop 136 and to the data input D of a second flip-flop (or latch) 138 connected in series with DEL line 116. Flip-flop 138 thus represents a simplified version of calibration circuit 126. The P0 signal passing through the DEL line 116 yields two delayed signals labeled Zn and P1 that can be merged in a single signal P1/Zn in the particular simplified implementation depicted in FIG. 6. Signal Zn represents the perturbed data stream that will be subsequently used to characterize the CDR circuit 108 jitter sensitivity. The P1 signal is used exclusively for calibration purposes. The P1 signal is applied to the clock input Ck of flip-flop 138, while the clock signal C is applied to its data input D, therefore the level seen on the clock signal C is sampled and memorized in flip-flop 138 on each rising edge of the P1 signal as signal H. Signal H is thus the signal P1 latched by flip-flop 138. Note that the calibration circuit 126 could be designed (or programmed) so that the delay variation could be tuned to cover the full period (or cycle) or a multiple thereof. A tunable delay line would be a valuable feature when considering a jitter modulation of one unit interval (UI) or more.

Figure 4:
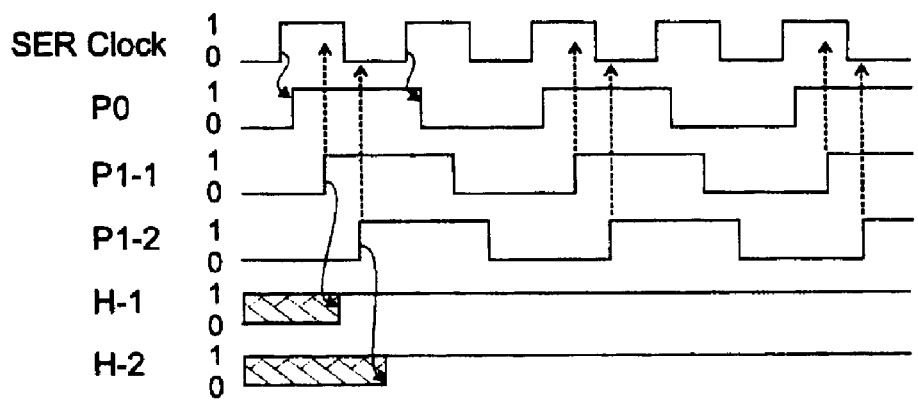
FIG. 4 shows the waveforms of the signals that are obtained at the output of the calibration circuit of FIG. 3.

For the sake of simplicity, it is assumed that the P0 signal, i.e. the serial data stream sent by SER circuit 120, is represented by a series of consecutive logic '1' and '0' and that the SER clock signal C has a 50% duty cycle. Next assume signal P0 is shifted slightly with respect to the rising edge of the SER clock C as depicted in FIG. 4. Now, if the delay of the DEL line 116 is just smaller than the C clock half-period, signal P1 is then represented by signal P1-1 and the value of the signal H1 corresponding to signal H output by flip-flop 138 will always be '1'. Conversely, if the delay of DEL line 116 is slightly greater than the C clock half-period, signal P1 will be represented by signal P1-2 and the value of signal H represented by signal H2 will always be '0'. Assuming that the DEL line 116 delay is obtained by adding a determined number of incremental delays, so that its delay characteristic can be determined with enough accuracy through a single measurement, then the calibration method consists of finding the smallest delay setting for which the flip-flop 138 output signal H goes to the low state. This setting corresponds to a delay equivalent to the SER circuit 120 clock signal C half-period, T/2.

Figure 5:
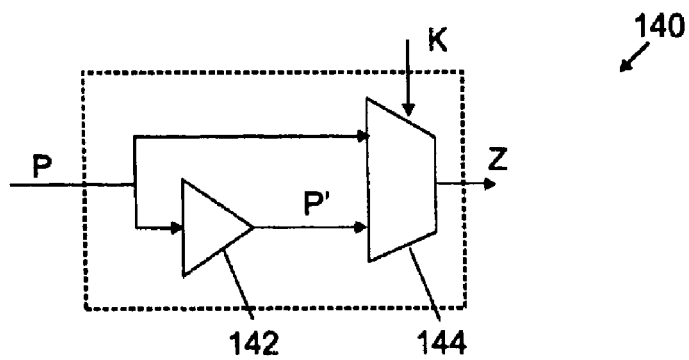
FIG. 5 is an example of an elementary circuit having two different selectable delays that can be used as a fundamental delay element from which to build the variable delay line depicted in FIG. 1.

FIG. 5 is an example of an elementary circuit 140 that can be used to build the variable delay line 116. In this simplified implementation, the input signal P can be delayed or not. To that end, the input signal P is directly applied to the first input of a two-way selector 144 and to the other input thereof through a delay element 142. The delay element 142 is typically a buffer, but can be any standard basic delay element from a user defined technology logic library or any custom delay element as well. The delayed signal is labeled P'''. The selector 144 is controlled by a control signal K, so that either the delayed signal P''' or the direct signal P is selected to deliver an output signal Z.

Figure 6:
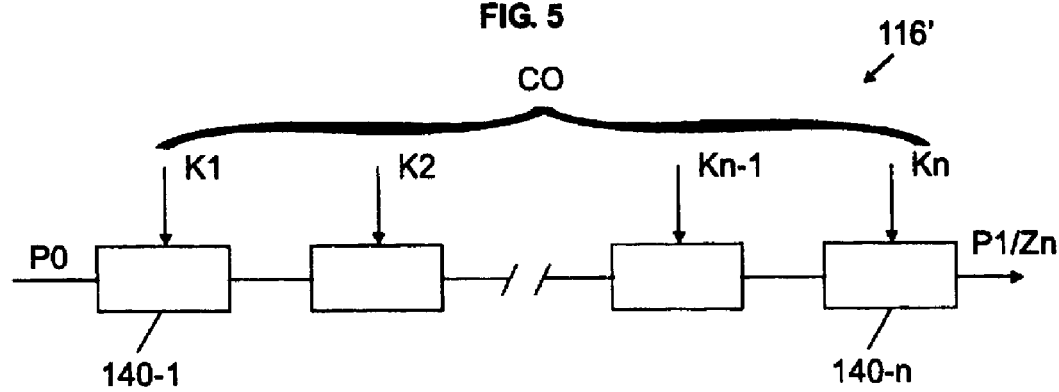
FIG. 6 shows the variable delay line when built with n elementary circuits of FIG. 5.

FIG. 6 shows how to serially connect n elementary delay elements 140 to build a variable delay line referenced 116". Control signal CO is a binary word representing the bundle of control signals K1 to Kn. For a certain set of values of said control signals K1 to Kn, the DEL line 116" delay is made equal to the SER clock half-period i.e. T/2. Control signal CO ensures that the overall delay of DEL line 116" is equal to T/2. The overall delay can thus be continuously varied between this value (the maximum) and a minimum delay value, so that the delay can be continuously varied between this maximum and minimum according a sine shaped curve. In this case, the useful delayed signal Zn and the calibration signal P1 are merged in a single signal P1/Zn. DEL line 116" has severe limitations due to its serial construction. When the number of elementary circuits 140 increases, the delay inherent to selector 144 can no longer be considered as negligible. As a result, the DEL line 116" of FIG. 6, cannot be tuned to generate narrowly calibrated delay increments (or steps).

Figure 7:
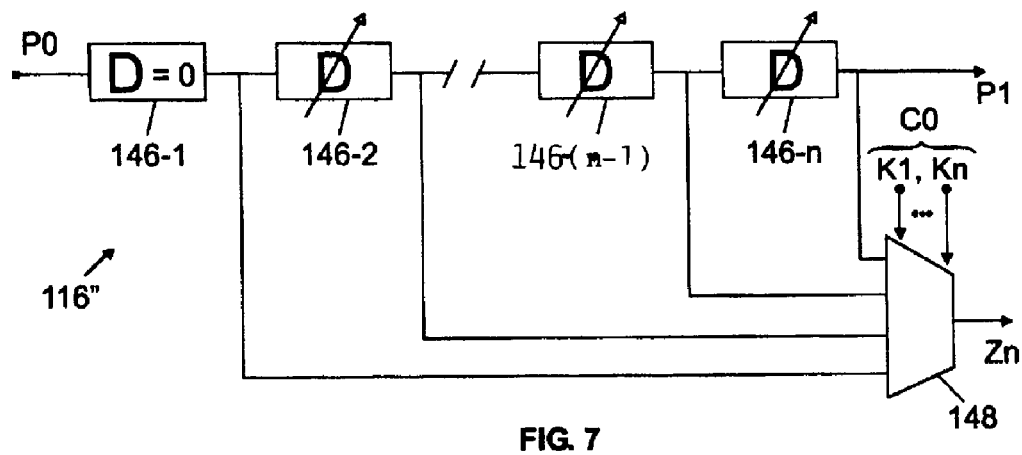
FIG. 7 shows another possible construction of the variable delay line depicted in FIG. 1 with DLL circuits having a variable delay.

To improve the characterization of the CDR circuit 108 jitter tolerance, it is preferable to design the DEL line as a delay locked loop (DLL) circuit. Turning to FIG. 7, a DLL circuit which 116" is constructed with n variable delay elements referenced 146-1 to 146-n. Although the delay elements are connected in series, each individual output is connected to a n-way multiplexor 148, so that in this case, the delayed useful signal Zn and the calibration signal P1 are independent of one another. Accordingly, Zn output of multiplexor 148 is used to apply the perturbed serial data stream. In this case, the delay of each elementary DLL element 146-1 to 146-n is tuned so that the sum of all these delays equals half the SER clock period, T/2. In other words, the delay increment (or step) D is then equal to the half clock period T/2 divided by the number "n" of stages, i.e. Step D=T/2n. The output P1 is only used to calibrate the delay step. Signal Zn is either signal P0 (no delay applied) or signal P0 delayed by T/2 and all the intermediate values in between according to the combined delay increments that can be added through control signal CO.

Figure 8:
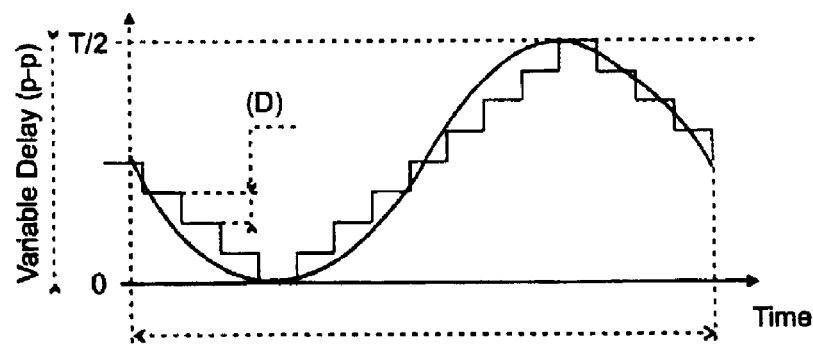
FIG. 8 shows the variable delay curve that can be obtained with the variable delay line of FIG. 7 as a function of time.

As is apparent in FIG. 8, the control of multiplexor 148 selection signals K1 to Kn allows the DEL line 116" to increment then decrement from T/2 to 0 at a given frequency determined by the control logic 112, thereby controlling the jitter amplitude as well as the jitter modulation rate. Note that the delay inherent to multiplexor 148 is substantial but compensated, since the CDR circuit 108 will compensate the equivalent phase shift, reacting on its internal PLL oscillator. In practice the delay increment or step D must be smaller than the high frequency CDR circuit tolerance specification (typically 15 to 20% of the bit cell interval).

Figure 9:
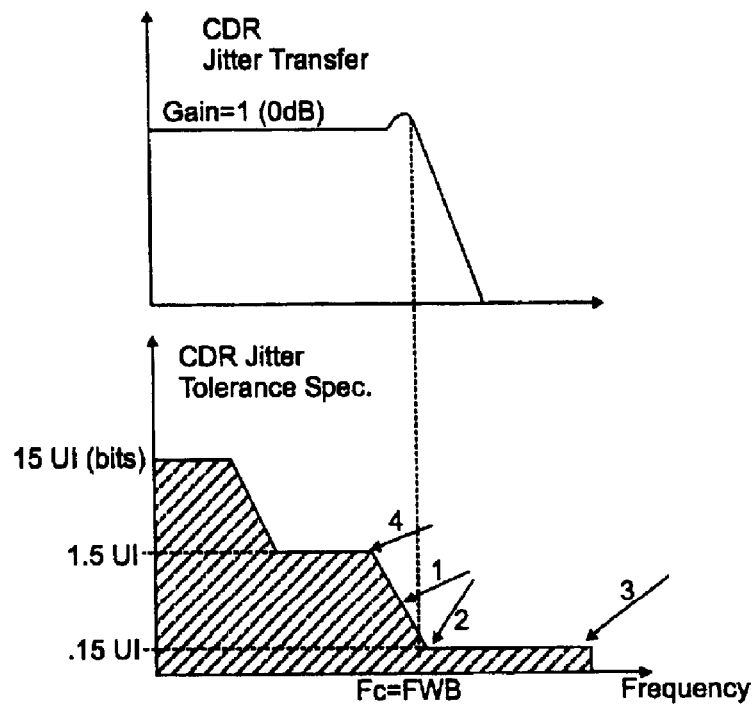
FIG. 9 shows the transfer and the jitter tolerance specification curves of the CDR circuit versus frequency.

The tolerance to jitter of CDR circuit 108 depicted in FIG. 1 is strongly dependent on its jitter transfer characteristic. Turning to FIG. 9, the upper drawing shows the jitter transfer curve, i.e. the CDR circuit gain versus frequency, which typically has the shape of a low pass filter plot. The lower drawing shows the CDR jitter tolerance specification (SONET/SDH template) versus frequency. In the upper drawing, the cutting frequency Fc also called Frequency Band Width (FWB), defines the boundary between two zones. In the first zone (DC to FWB), the CDR circuit tracks the data jitter and thus locks the sampling clock to the data edges. In the second zone, above FWB, the CDR circuit progressively loses lock, i.e. stops following the jitter rate (within a decade), and the internal PLL finally gets into a free running zone.

Referring to the lower drawing of FIG. 9, there are four zones of interest, labeled 1 to 4, to be checked for characterizing the behavior of the CDR circuit to jitter tolerance. These zones of interest are typically at weakest immunity (1,2) and at maximum data rate (3). The first zone in frequency is a little lower than FWB, where the jitter transfer gain may show a peak (apparent in the upper drawing) denoting a jitter multiplication (low dumping ratio<1). The second zone is typically in the range of 4 to 8 times FWB. In this range the CDR progressively loses lock with data edges. However, due to phase revolution in the CDR circuit, some residual data jitter fed to the sampling clock is summed with the incoming data jitter. The third zone is at a very high frequency and thus close to the maximum data rate. There, the sampling clock and the data are decorrelated and the jitter components are summed together. This is the area used to qualify the CDR clock jitter. The fourth zone is interesting to verify the CDR tracking capability due to elevated jitter magnitude above 1 UI (Unit Interval). Checking CDR circuit jitter tolerance in this fourth zone, really demonstrates that the CDR circuit satisfactorily operates, as it is able to follow the data jitter, i.e. it locks the sampling clock to the jittered data edges. In summary, the improved SERDES circuit 102 allows in-situ jitter tolerance/ immunity characterization of the CDR circuit incorporated within the SERDES circuit. The SERDES circuit generates a perturbed data flow and analyzes whether the data is still recovered correctly. It does not requires additional external test equipment and may be used to characterize the jitter specifically introduced by the physical link between local and distant SERDES circuits, thereby extending the self diagnostic capacity of the SERDES circuit to the quality of the physical link. The diagnostic function may be performed at each power-on or initiated at any time on request. The test results can be made available in a register for further analysis. Moreover, it can be implemented at very low cost and consumes very small circuit area. Finally, depending upon whether a large delay variation is suddenly applied to the serial data stream or if a continuous delay variation is applied during the time, it is possible to measure the width of the data recovery window or to assert the capacity of the CDR circuit to still follow the jittered data.

The capability to verify the jitter tolerance performance of the CDR circuit embedded in such an improved SERDES circuit is a powerful feature. Admittedly, the jitter tolerance performance is the most critical specification of any CDR circuit to be met and also is the most important parameter to maintain the Bit Error Rate (BER) performance at the receiving side of the SERDES circuit. Finally, the overall test coverage is improved and consequently the product quality delivered to the customer.

While the invention has been described in detail, the foregoing description is in all aspects illustrative and not restrictive. It is understood that numerous other modifications and variations can be devised without departing from the scope of the invention.

What is claimed is:

1. A method of characterizing jitter sensitivity in a serializer/deserializer (SERDES) circuit having built-in self test (BIST) capabilities, the method comprising:

providing a clock and data recovery (CDR) circuit coupled to said SERDES circuit that generates recovered clock and data from an incoming serial data stream;

generating from a deserializer circuit connected to said CDR circuit corresponding data (Parallel Data Out) and clock (DES clock) in a parallel format;

generating BIST patterns from a programmable pattern generator;

receiving either the BIST patterns or input data (Parallel Data In) in a parallel format on a data input of a serializer circuit and generating a serial data stream from an external clock (SER clock) on a clock input of the serializer circuit;

adding a perturbation delay to said serial data stream to produce a perturbed serial data stream;

outputting either the serial data stream or the perturbed serial data stream in a loop back to the CDR circuit; and detecting a start-of-frame pattern using a dedicated signal (FD).

* * * * *